(12) United States Patent
Obuchi et al.

(10) Patent No.: US 6,758,222 B2
(45) Date of Patent: Jul. 6, 2004

(54) PROCESSING METHOD FOR SUBSTRATE

(75) Inventors: Kazuto Obuchi, Kanagawa (JP);
Kaoru Mizutani, Kanagawa (JP);
Atsushi Matsushita, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 347 days.

(21) Appl. No.: 10/073,429

(22) Filed: Feb. 11, 2002

(65) Prior Publication Data
US 2002/0108710 A1 Aug. 15, 2002

(30) Foreign Application Priority Data

Feb. 9, 2001 (JP) ........................................ 2001-033246

(51) Int. Cl.$^7$ .............................. C23F 5/00; B44C 1/22; H01L 21/302
(52) U.S. Cl. ........................... 134/1.1; 134/1.2; 216/67; 427/460
(58) Field of Search ...................... 134/1.1, 1.2; 216/67; 427/460; 156/359.29

(56) References Cited
U.S. PATENT DOCUMENTS 5,980,684 A * 11/1999 Hori et al. ............. 156/345.31
6,630,053 B2 * 10/2003 Yamagishi et al. ..... 156/345.32

FOREIGN PATENT DOCUMENTS

| JP | 02-138467 | * | 5/1990 |
| JP | 10-030183 | | 2/1998 |

* cited by examiner

*Primary Examiner*—George A. Goudreau
(74) *Attorney, Agent, or Firm*—Carrier, Blackman & Associates, P.C.; Joseph P. Carrier; William D. Blackman

(57) ABSTRACT

A method of processing a substrate resists unwanted generation of plasma within a waiting chamber of a processing apparatus. The waiting chamber and a processing chamber are depressurized, and an untreated substrate is placed into the processing chamber, by raising a mounting table. A lower opening of the processing chamber is air-tightly closed by an edge portion of the mounting table. Thereafter, gas is introduced into the waiting chamber to increase the pressure therein, and in parallel with this, reactive gas is introduced into the processing chamber, but at a much lower pressure than that of the waiting chamber. Under this condition, high frequency power is applied to electrodes of the processing chamber to generate plasma therein. The likelihood of unwanted plasma generation in the waiting chamber is significantly reduced by the higher pressure therein, relative to the processing chamber.

5 Claims, 3 Drawing Sheets

PROCESSING METHOD FOR SUBSTRATE

BACKGROUND OF THE INVENTION

1. Field of the Invention

The present invention relates to a processing method for a substrate, in particular, for conducting, under a condition of reduced pressure, an ashing process or the like upon the substrate, such as for example, a semiconductor wafer or a glass substrate.

2. Description of Prior Art

For the purpose of effectively conducting processing such as an ashing process under a condition of reduced pressure, conventionally, an apparatus is known in which a load-lock chamber is provided in addition to a processing chamber. In the apparatus, while a substrate is processed in the processing chamber, another substrate to be processed next is loaded into the load-lock chamber to wait, and the load-lock chamber is depressurized to the pressure of the processing chamber. After the processing in the processing chamber is completed, the treated substrate in the processing chamber is taken out, and the untreated substrate waiting in the load-lock chamber is transferred into the processing chamber by means of a robot provided in the load-lock chamber.

In the aforementioned processing apparatus, since a general-purpose robot is provided in the load-lock chamber, thereby enabling transfer of substrates from a cassette and transfer of substrates from and to the processing chamber by means of the robot, the robot becomes complex and large-scaled in the structure and the load-lock chamber volume also becomes large. Therefore, time is required for depressurizing the load-lock chamber to the pressure of the processing chamber. Furthermore, a large quantity of power is necessary for depressurizing the load-lock chamber.

The present inventors have already proposed a processing apparatus, for example, in Japanese Patent Application Laid-open No. Hei 10-30183 (1998), in which a transfer robot is provided on the outside of the load-lock chamber, while the inside thereof is provided a handler unit for transferring substrates from the transfer robot and for transferring substrates from and to the processing chamber. Therefore, by making the structure of the handler unit simple, it is possible to obtain a small volume load-lock chamber.

In such a conventional processing apparatus, comprising the aforementioned load-lock chamber, a waiting chamber is provided below the processing chamber for generating plasma. The waiting chamber and the load-lock chamber communicate with each other through a shutter. Accordingly, for processing a substrate, the load-lock chamber, the processing chamber, and the waiting chamber have the same pressure, so as to conduct the following steps: transferring a substrate from the load-lock chamber to the waiting chamber, closing the shutter between the load-lock chamber and the waiting chamber, inserting the substrate from the waiting chamber to the processing chamber while reducing the pressure within the waiting chamber and the processing chamber, and generating plasma within the processing chamber, so as to conduct a predetermined treatment.

As was mentioned above, in a conventional processing method which uses the apparatus comprising the load-lock chamber, the waiting chamber and the processing chamber have the same pressure at the time of conducting an ashing treatment to the substrate in the processing chamber.

The processing chamber is, in many cases, made of synthetic quartz, but in general, the waiting chamber is made of aluminum alloy, having been treated with alumilite on the interior surfaces thereof.

Plasma is easy to generate in lower pressure. Therefore, in a case of the conventional processing method, since the waiting chamber is also in a depressurized condition during processing, residual gas remaining within the waiting chamber in a very small amount sometimes becomes plasma in consequence of the influence of applying high frequency power for generating plasma.

Once plasma is generated within the waiting chamber, plasma generated in the processing chamber becomes unstable due to the change in impedance. There is also a possibility of metal contamination occurring through peeling or flaking of the alumilite thin film due to the plasma, since the waiting chamber is made of aluminum alloy having been treated with alumilite on the interior surfaces thereof.

SUMMARY OF THE INVENTION

Therefore, for solving problems such as were mentioned above, the present invention provides a processing method which uses a processing apparatus in which a waiting chamber is provided below a processing chamber and a load-lock chamber is provided in addition to the waiting chamber, wherein pressure within the waiting chamber is kept high enough for no plasma to be generated therein, during which time a substrate is treated within the processing chambers in which plasma is generated under a depressurized condition. The pressure in the waiting chamber is, specifically, preferred to be in a range of 200 Pa to 3000 Pa.

Because generation of plasma in the waiting chamber is controlled during processing of a substrate, plasma is stably generated in the processing chamber without change in impedance of the processing portion as a whole. Also, drawbacks of the waiting chamber can be solved, such as peeling of the alumilite thin film applied to the interior surfaces of the waiting chamber.

DETAILED DESCRIPTION OF PREFERRED EMBODIMENTS

Figure 1:
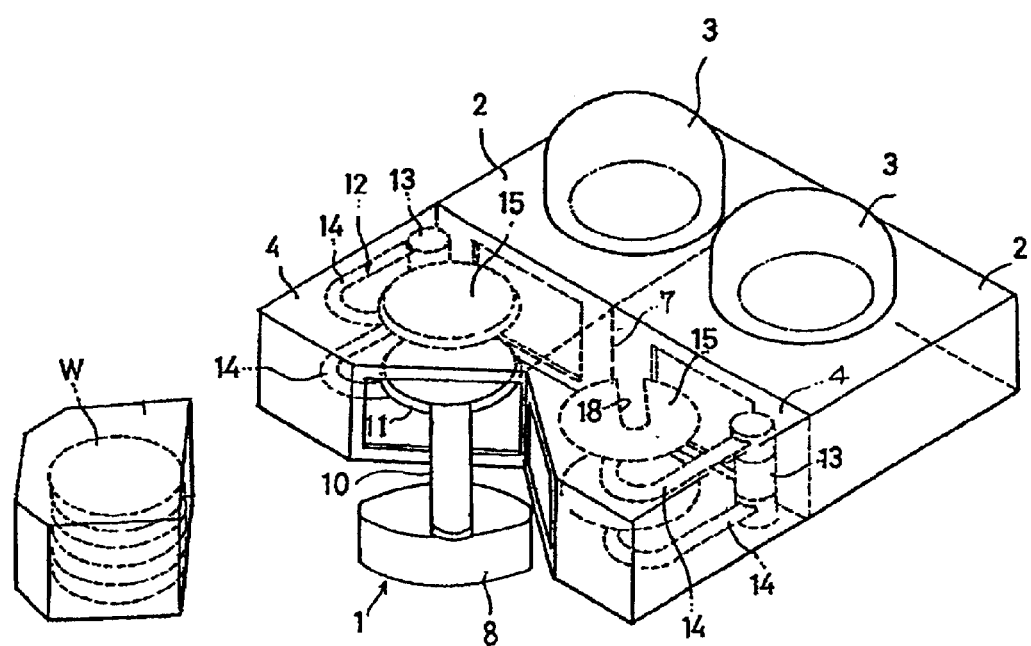
FIG. 1 is a perspective view of the entire apparatus for implementing the processing method according to the present invention.

Hereinafter, an embodiment according to the present invention will be filly explained by referring to the attached drawings.

In a processing apparatus, two processing portions are provided for one transfer robot 1, and each of the processing portions is comprised of a waiting chamber 2 made of aluminum alloy and a processing chamber 3 made of synthetic quartz provided on the waiting chamber 2. To the waiting chamber 2 is also provided a load-lock chamber 4.

Between the load-lock chamber 4 and the waiting chamber 2 is provided a shutter 5, and in the surface of the load-lock chamber 4 opposing the transfer robot 1 is provided a shutter 6 for shutting off from the outside. Further, a partition 7 is provided as a shut off between a pair of the load-lock chambers 4 and 4, and between a pair of the waiting chambers 2 and 2.

The transfer robot 1 mentioned above comprises an arm 10 on a rotatable table 8, the arm 10 being freely movable back and forth in the radial direction. At the tip of the arm 10 is provided a receiver portion 11 for a substrate W. Either the table 8 or the arm 10 can be lifted up and lowered. Although only the receiver portion 11 of the arm 10 is shown in the figure, it may be possible to provide two arms and to make each [being] independently controllable.

Within the load-lock chamber 4 is provided a handler unit 12 for transferring a substrate W into the inside of the processing chamber 2 and removing a substrate W from the inside of the processing chamber 2.

The handler unit 12 has a shaft 13, and the base end portions of two curved or bent arms 14 are attached to the upper and lower portions of the shaft 13 so as to freely rotatable in the horizontal surface. At the tip of the each arm 14 is provided a hand portion 15, and a cutting portion 18 is formed in the radial direction from the central portion to the outer peripheral portion of the hand portion 15.

An exhaust pipe 20 and an introduction pipe 21 for $N_2$ or inert gas are connected to the waiting chamber 2. An exhaust pipe 30 and a reactive gas introduction pipe 31 from a mass-flow controller are connected to the processing chamber 3.

Further, a mounting table 22 is provided within the waiting chamber 2 mentioned above. The mounting table 22 can be lifted up and lowered by means of a cylinder unit 23, which is housed within a flexible tube 24, so that the cylinder unit 23 can be driven under a condition of being shut off from the inside of the waiting chamber 2. At the position when the mounting table 22 reaches the upper limit, a flange portion of the mounting table 22 air-tightly seals the lower end opening of the processing chamber 3.

An explanation will be given of the processing steps in the processing apparatus having the above-mentioned structure. However, the explanation will be made of only one of the processing portions. Also, the explanation will be started from a condition that an untreated substrate W is housed within the waiting chamber 2, an untreated substrate W is held by the hand portion 15 at the upper side of the load-lock chamber 4, the hand portion 15 at the lower side is vacant, and both of the shutters 5 and 6 are closed.

From the condition mentioned above, as is shown in FIG. 2, the pressure within the waiting chamber 2 and the processing chamber 3 is reduced down to several Pa (Pascal) through the exhaust pipes 20 and 30. The mounting table 22 is lifted up, so that the untreated substrate W is in the processing chamber 3, and the mounting table 22 air-tightly seals the lower end opening of the processing chamber 3.

Figure 3:
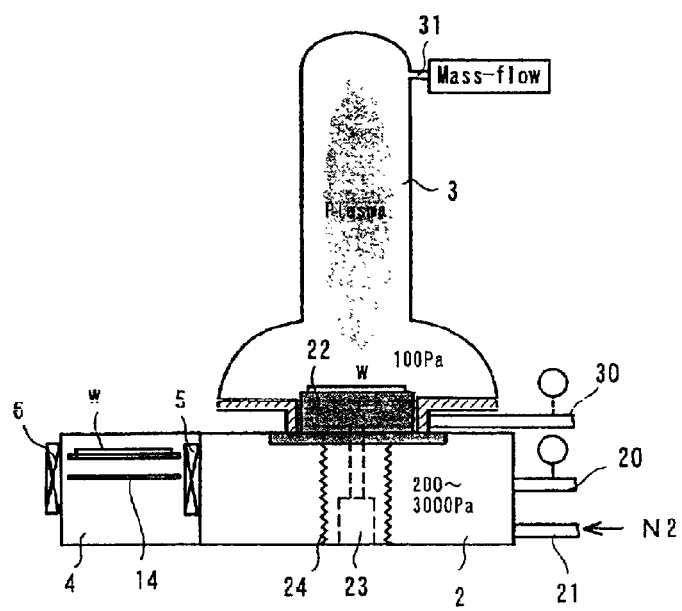
FIG. 3 is another cross-sectional view of the apparatus of FIG. 1 for explaining the sequential steps in the same processing method.

Next, nitrogen gas (or inert gas) is introduced into the waiting chamber 2 by using the pipe 21, thereby increasing the pressure within the waiting chamber 2 up to 200–3000 Pa. In parallel with this, gas for an ashing process is introduced from the mass-flow into the processing chamber 3. As a result, the pressure within the processing chamber 3 rises to around 100 Pa. Under this condition, as shown in FIG. 3, high frequency power is applied to electrodes of the processing chamber 3, so as to generate plasma, thereby conducting the ashing process on the substrate W.

Figure 4:
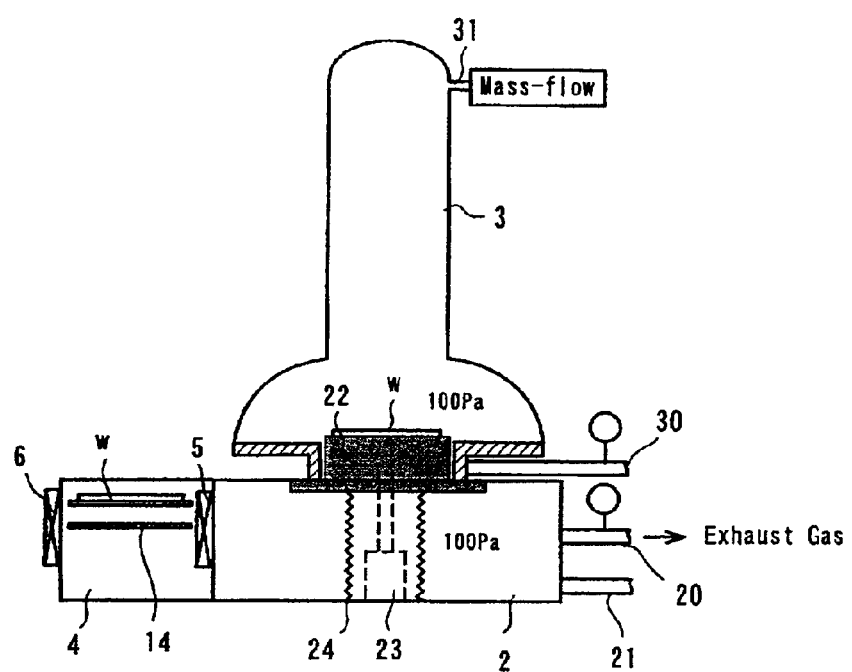
FIG. 4 is still another cross-sectional view of the apparatus of FIG. 1 for explaining the sequential steps in the same processing method.

After completing the process mentioned above, as shown in FIG. 4, the pressure within the waiting chamber 2 is reduced through the pipe 20 until it is equal to the pressure within the processing chamber 3, and the mounting table 22 is then lowered. In this instance, the pressure within the load-lock chamber 4 is also reduced to be equal to that of the waiting chamber 2.

Figure 2:
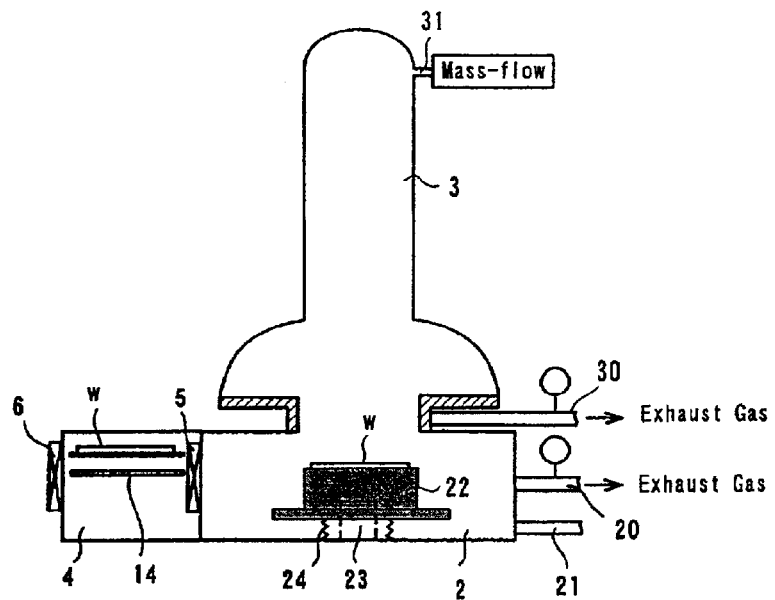
FIG. 2 is a first cross-sectional view of the apparatus of FIG. 1 for explaining sequential steps in the same processing method.

Next, the shutter 5 is opened, and the arm 14 at the lower side is rotated to enter the waiting chamber 2, thereby receiving the treated substrate W by the vacant hand 15. The arm 14 at the lower side returns into the load-lock chamber 4. Next, the arm 14 at the upper side is rotated to enter the waiting chamber 2, thereby transferring the untreated substrate W held on the hand 15 onto the mounting table 22. The arm 14 at the upper side returns into the load-lock chamber 4. This condition is shown in FIG. 2.

Next, the above-mentioned processing will be conducted, and in parallel with this, the pressure in the load-lock chamber is made to return to atmospheric pressure and the treated substrate W is replaced by an untreated substrate W.

As was fully explained in the above, according to the present invention, for conducting an ashing process or the like to a substrate by using a processing apparatus, comprising a processing chamber and a waiting chamber provided below the processing chamber in which a load-lock chamber is provided to the waiting chamber, since the pressure within the waiting chamber is kept to be so high that no plasma is generated therein while a substrate is treated within the processing chamber maintained in a depressurized condition so as to generate plasma therein, no change occurs in impedance of the processing portion as a whole. As a result, plasma can be generated with stability in the processing chamber, and also a substrate can be protected from contamination because no peeling occurs on the inner surfaces thereof due to plasma.

What is claimed is:

1. A method of processing a substrate in an apparatus comprising a waiting chamber and a processing chamber, said method comprising the steps of:

a) simultaneously depressurizing the waiting chamber and the processing chamber;

b) raising a mounting table having an untreated substrate thereon, thereby placing the untreated substrate into the processing chamber;

c) isolating the processing chamber from the waiting chamber by forming a seal therebetween, using an edge portion of the mounting table;

d) introducing a first gas into the waiting chamber to increase the pressure therein to a first, elevated pressure level;

e) introducing a second, reactive gas into the processing chamber to increase the pressure therein to a second pressure level which is lower than the first pressure level; and f) applying high frequency power to electrodes of the processing chamber to generate plasma therein to treat said substrate;

whereby the elevated pressure level in the waiting chamber resists unwanted plasma generation therein.

2. A processing method as claimed in claim 1, wherein the elevated pressure level in said waiting chamber when a substrate is processed within said processing chamber is in a range of 200 Pa–3000 Pa.

3. A method of conducting an ashing process on a vitreous substrate selected from the group consisting of semiconductor wafers and glass substrates, in an apparatus comprising a hollow housing containing a cavity which is partitionable into a waiting chamber and a processing chamber, said method comprising the steps of:

a) depressurizing the cavity;

b) raising a mounting table having an untreated substrate thereon, thereby placing the untreated substrate into the processing chamber;

c) isolating the processing chamber from the waiting chamber by forming a seal therebetween, using the mounting table;

d) introducing a first, substantially inert gas into the waiting chamber to increase the pressure therein to a first, elevated pressure level;

e) introducing a second, reactive gas into the processing chamber to increase the pressure therein to a second pressure level which is lower than the first pressure level; and f) applying high frequency power to electrodes of the processing chamber to generate plasma therein to treat said substrate;

whereby the elevated pressure level in the waiting chamber resists unwanted plasma generation therein.

4. A processing method as defined in claim 3, wherein the elevated pressure level in said waiting chamber is in a range of 200 Pa–3000 Pa.

5. The processing method of claim 4, wherein the second pressure level is about 100 Pa.

* * * * *

UNITED STATES PATENT AND TRADEMARK OFFICE
CERTIFICATE OF CORRECTION

PATENT NO.    : 6,758,222 B2
DATED         : July 6, 2004
INVENTOR(S)   : Obuchi et al.

It is certified that error appears in the above-identified patent and that said Letters Patent is hereby corrected as shown below:

Column 2,
Line 28, between "chambers" and "in which" insert -- a --;
Line 58, between "will be" and "explained by" change "filly" to -- fully --.

Column 3,
Line 13, between "make each" and "independently" please delete "being";
Line 20, between "so as to" and "freely rotatable" insert -- be --;
Line 21, between "tip of" and "each arm" delete "the".

Signed and Sealed this

Twenty-ninth Day of March, 2005

JON W. DUDAS
*Director of the United States Patent and Trademark Office*